US010254046B2

(12) United States Patent
Yamazaki et al.

(10) Patent No.: US 10,254,046 B2
(45) Date of Patent: Apr. 9, 2019

(54) MAGNETIC ANNEALING APPARATUS

(71) Applicant: Tokyo Electron Limited, Tokyo (JP)

(72) Inventors: Mitsuru Yamazaki, Iwate (JP); Barry Clarke, Dublin (IE); Ian Colgan, Dublin (IE); George Eyres, Dublin (IE); Ioan Domsa, Dublin (IE)

(73) Assignee: Tokyo Electron Limited, Tokyo (JP)

( * ) Notice: Subject to any disclaimer, the term of this patent is extended or adjusted under 35 U.S.C. 154(b) by 592 days.

(21) Appl. No.: 14/840,486

(22) Filed: Aug. 31, 2015

(65) Prior Publication Data

US 2016/0061526 A1   Mar. 3, 2016

(30) Foreign Application Priority Data

Sep. 3, 2014   (JP) ................. 2014-179343

(51) Int. Cl.
| | |
|---|---|
| *F27B 5/08* | (2006.01) |
| *F27B 5/14* | (2006.01) |
| *F27D 1/00* | (2006.01) |
| *F27D 7/06* | (2006.01) |
| *H01L 43/12* | (2006.01) |
| *F27B 17/00* | (2006.01) |
| *F27D 99/00* | (2010.01) |
| *H01L 21/67* | (2006.01) |
| *H01L 21/677* | (2006.01) |
| *F27D 5/00* | (2006.01) |
| *H01L 21/673* | (2006.01) |

(52) U.S. Cl.
CPC ............ *F27B 17/0025* (2013.01); *F27B 5/08* (2013.01); *F27D 99/0001* (2013.01); *H01L 21/67115* (2013.01); *H01L 21/67754* (2013.01); *H01L 43/12* (2013.01); *F27B 17/005* (2013.01); *F27D 5/0037* (2013.01); *H01L 21/67313* (2013.01)

(58) Field of Classification Search
None
See application file for complete search history.

(56) References Cited

U.S. PATENT DOCUMENTS

| | | | | |
|---|---|---|---|---|
| 6,455,815 | B1 * | 9/2002 | Melgaard et al. | 219/390 |
| 6,496,648 | B1 * | 12/2002 | Mack et al. | 219/390 |
| 9,822,424 | B2 * | 11/2017 | Ishii et al. | 219/390 |
| 9,851,149 | B2 * | 12/2017 | Yamazaki et al. | 219/390 |

(Continued)

FOREIGN PATENT DOCUMENTS

| | | |
|---|---|---|
| CN | 1748268 A | 3/2006 |
| JP | 60-92826 U | 6/1985 |

(Continued)

*Primary Examiner* — Joseph M Pelham
(74) *Attorney, Agent, or Firm* — Abelman, Frayne & Schwab (57) ABSTRACT

Disclosed is a magnetic annealing apparatus including a processing container having a horizontally-elongated tubular shape and configured to perform a magnetic annealing processing on a plurality of substrates accommodated therein in a magnetic field; a heating unit provided to cover at least a part of a surface of the processing container that extends in a longitudinal direction, from outside; a magnet provided to cover the heating unit from the outside of the heating unit; a substrate holder configured to hold the plurality of substrates within the processing container; and a heat shielding plate provided to surround a part of the substrate holder.

15 Claims, 7 Drawing Sheets

(56) References Cited

U.S. PATENT DOCUMENTS

| | | |
|---|---|---|
| 2006/0022387 A1 | 2/2006 | Ueno |
| 2014/0284321 A1* | 9/2014 | Ono et al. .................... 219/390 |
| 2016/0061525 A1* | 3/2016 | Yamazaki et al. ............ 219/390 |
| 2016/0216032 A1* | 7/2016 | Colgan et al. ................ 219/390 |
| 2017/0077396 A1* | 3/2017 | Yamazaki .................... 219/390 |
| 2017/0335458 A1* | 11/2017 | Murata et al. ................ 219/392 |

FOREIGN PATENT DOCUMENTS

| | | |
|---|---|---|
| JP | 63-047923 A | 2/1988 |
| JP | 2004-211167 A | 7/2004 |
| JP | 2004-263206 A | 9/2004 |

\* cited by examiner

MAGNETIC ANNEALING APPARATUS

CROSS-REFERENCE TO RELATED APPLICATIONS

This application is based on and claims priority from Japanese Patent Application No. 2014-179343, filed on Sep. 3, 2014 with the Japan Patent Office, the disclosure of which is incorporated herein in its entirety by reference.

TECHNICAL FIELD

The present disclosure relates to a magnetic annealing apparatus.

BACKGROUND

A magnetic random access memory (MRAM), which is one of non-volatile memories, has recently attracted attention as a next generation semiconductor memory device. The MRAM is fabricated by performing a heat treatment (magnetic annealing) on a magnetic material film formed on a workpiece to be processed ("workpiece") which is, for example, a semiconductor wafer ("wafer"), in a strong magnetic field so as to the material film exhibit a magnetic property.

For example, Japanese Patent Laid-Open Publication No. 2004-263206 discloses a magnetic annealing apparatus that uses a solenoid type magnetic as a means for generating a magnetic field for performing a magnet annealing processing and requires a relatively small installation area.

SUMMARY

According to an aspect of the present disclosure, there is provided a magnetic annealing apparatus including a processing container having a horizontally-elongated tubular shape and configured to perform a magnetic annealing processing on a plurality of substrates accommodated therein in a magnetic field; a heating unit provided to cover at least a part of a surface of the processing container that extends in a longitudinal direction, from outside; a magnet provided to cover the heating unit from the outside of the heating unit; a substrate holder configured to hold the plurality of substrates within the processing container; and a heat shielding plate provided to surround a part of the substrate holder.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 2A and 2B are views illustrating an exemplary configuration of a boat loader.

FIGS. 3A to 3D are views illustrating an exemplary heat shielding plate.

FIG. 4A is a view illustrating an exemplary test and research purpose magnetic annealing apparatus. FIG. 4B is a view illustrating an exemplary magnetic annealing apparatus according to an exemplary embodiment of the present disclosure.

FIGS. 5A to 5C are views illustrating a relationship between a heater and a heat shielding plate in a magnetic annealing apparatus according to an exemplary embodiment of the present disclosure.

FIGS. 6A and 6B are views illustrating an exemplary magnetic annealing apparatus according to an exemplary embodiment of the present disclosure in which the number of heat shielding plates is increased.

FIGS. 7A and 7B are views illustrating simulation results of FIG. 6A and FIG. 6B.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The magnetic annealing apparatus disclosed in Japanese Patent Laid-Open Publication No. 2004-263206 is a small-scale apparatus for use in research and development for a hard disk drive (HDD) or an MRAM and is not aimed at mass production. Considering market size of MRAM expected in the forthcoming years, what is requested is to develop a magnetic annealing apparatus which is able to continuously or semi-continuously process a plurality (e.g., 100 sheets) of wafers. However, when a magnetic annealing apparatus is enlarged in scale, there is a problem in that it is difficult to maintain thermal uniformity of the plurality of wafers.

Accordingly, an object of the present disclosure is to provide a magnetic annealing apparatus which is able to process a plurality of substrates while maintaining the thermal uniformity.

According to an exemplary embodiment of the present disclosure, there is provided a magnetic annealing apparatus including a processing container having a horizontally-elongated tubular shape and configured to perform a magnetic annealing processing on a plurality of substrates accommodated therein in a magnetic field; a heating unit provided to cover at least a part of a surface of the processing container that extends in a longitudinal direction, from outside; a magnet provided to cover the heating unit from the outside of the heating unit; a substrate holder configured to hold the plurality of substrates within the processing container; and a heat shielding plate provided to surround a part of the substrate holder.

In the magnetic annealing apparatus described above, the heat shielding unit is provided at a position where the heat shielding unit does not face the heating unit.

In the magnetic annealing apparatus described above, the position where the heat shielding unit does not face the heating unit corresponds to an end surface extending in a direction substantially perpendicular to the longitudinal direction.

In the magnetic annealing apparatus described above, the substrate holder is configured to hold the plurality of substrates at predetermined intervals along the longitudinal direction in a substantially vertically standing state.

In the magnetic annealing apparatus described above, the substrate holder is configured to hold the plurality of substrates at predetermined intervals in the vertical direction in a substantially horizontally placed state so as to form a loaded body.

In the magnetic annealing apparatus as described above, the substrate holder is configured to hold a plurality of loaded bodies in parallel with each other along the longitudinal direction.

In the magnetic annealing apparatus as described above, the heating unit covers substantially the whole of the surface of the processing container that extends in the longitudinal direction.

In the magnetic annealing apparatus described above, the heat shielding plate is provided to cover each of the uppermost surface and the lowermost surface of the plurality of substrates through the substrate holder.

In the magnetic annealing apparatus described above, the heat shielding plate is constituted with a non-magnetic metal plate.

In the magnetic annealing apparatus described above, the heat shielding plate includes a plurality of thin metal plates.

In the magnetic annealing apparatus described above, the plurality of thin metal plates are arranged at predetermined intervals with spacers being interposed therebetween.

In the magnetic annealing apparatus described above, the heat shielding plate includes a plurality of louver-shaped slits formed by cutting and bending.

In the magnetic annealing apparatus described above, a length of the heating unit in the longitudinal direction is 1.7 times that of the substrate holder or more.

In the magnetic annealing apparatus described above, the processing container has a cylindrical shape.

According to the present disclosure, the thermal uniformity may be enhanced.

Hereinafter, exemplary embodiments of the present disclosure will be described with reference to accompanying drawings.

First, descriptions will be made on a configuration of a magnetic annealing apparatus 200 including a wafer boat.

Figure 1:
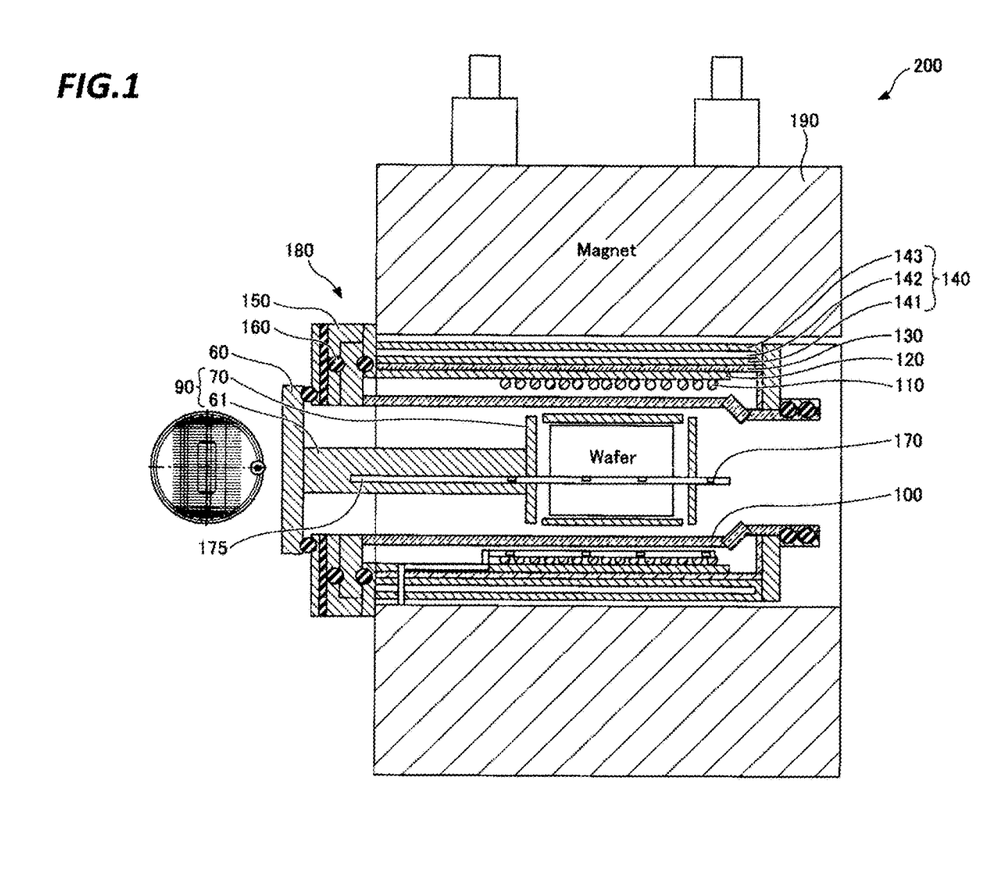
FIG. 1 is a cross-sectional view illustrating a whole configuration of a magnetic annealing apparatus.

FIG. 1 is a cross-sectional view illustrating the whole configuration of the magnetic annealing apparatus 200. The magnetic annealing apparatus 200 includes an annealing furnace 180 and a magnet 190. As illustrated in FIG. 1, for example, the magnet 190 is installed to cover the outer periphery of the longitudinally extending surface of the annealing furnace 180. The magnet 190 may be any magnet as long as it is capable of generating a uniform magnetic field of a predetermined direction (e.g., a front-rear direction) in a region where wafers W are held in the annealing furnace 180. For example, a solenoid type magnet may be used as the magnet 190 as described above.

The annealing furnace 180 includes a processing container 100, a heater 110, a heater supporting metal plate 120, a heat insulator 130, a water-cooled jacket 140, a flange 150, an O-ring 160, a thermocouple 170, and a quartz tube 175. Further, the annealing furnace 180 is configured to accommodate a cap 60, a wafer boat support 61, and a wafer boat 70 in the processing container 100. Meanwhile, the wafer boat 70 is configured to hold wafers W.

The processing container 100 is a container that accommodates the wafer boat 70 so as to perform a magnetic annealing processing. The processing container 100 has a horizontally-elongated tubular shape. The processing container 100 may have any horizontally-elongated tubular shape as long as it can accommodate the wafer boat 70. For example, the processing container 100 may be configured in a cylindrical shape. The processing container 100 may be configured as, for example, a quartz tube made of quartz.

The heater 110 is a means for heating the wafers W. The heater 110 is installed outside the processing container 100 and is longer than the wafer boat 70 so as to cover the wafer boat 70 in the longitudinal direction of the processing container 100. The heater 110 is installed along the longitudinal direction so as to cover the longitudinally extending surface of the processing container 100. Meanwhile, the heater 110 is not installed in places covering both ends of the cylindrical processing container 100 from the viewpoint of securing a carrying-in/out path of the wafer boat 70 and a vacuum exhaust path.

The heater supporting metal plate 120 is a metal plate for supporting the heater 110 attached thereto. The heat insulator 130 is a member for confining heat radiated from the heater 110 therein so as to prevent the heat from emitting to the outside where the magnet 190 is present. The heat insulator 130 is installed to cover the outer periphery of the heater supporting metal plate 120. The water-cooled jacket 140 is installed in order to prevent the temperature of the annealing furnace 180 from excessively increasing, and is installed to cover the outer periphery of the heat insulator 130. The water-cooled jacket 140 includes an inner double pipe 141 and an outer double pipe 143 so that a coolant 142 circulates between the inner double pipe 141 and the outer double pipe 143. The coolant 142 may be, for example, cold water or any other coolant. With such a configuration, it is possible to prevent a large amount of heat from being radiated to the magnet 190.

The flange 150 is a structure that is installed in order to appropriately fix the processing container 100. The flange 150 holds the processing container 100 via the O-ring 160. The O-ring 160 is also installed as necessary in order to airtightly fix other parts. The thermocouple 170 is a temperature detecting means for measuring a temperature around the wafers W in the processing container 100, and is installed as necessary in order to perform a temperature control. Meanwhile, the thermocouple 170 may be arranged in, for example, the quartz pipe 175.

Meanwhile, the inside of the processing container 100 is opened at the front end side of the wafer boat 70 (opposite side to the cap 60), and evacuation is accomplished through the opening. Since the magnetic annealing processing is performed under a high vacuum, the inside of the processing container 100 is evacuated by, for example, a turbo molecular pump and maintained at a high vacuum of, for example, about $5 \times 10^{-7}$ Torr.

Figure 2A:
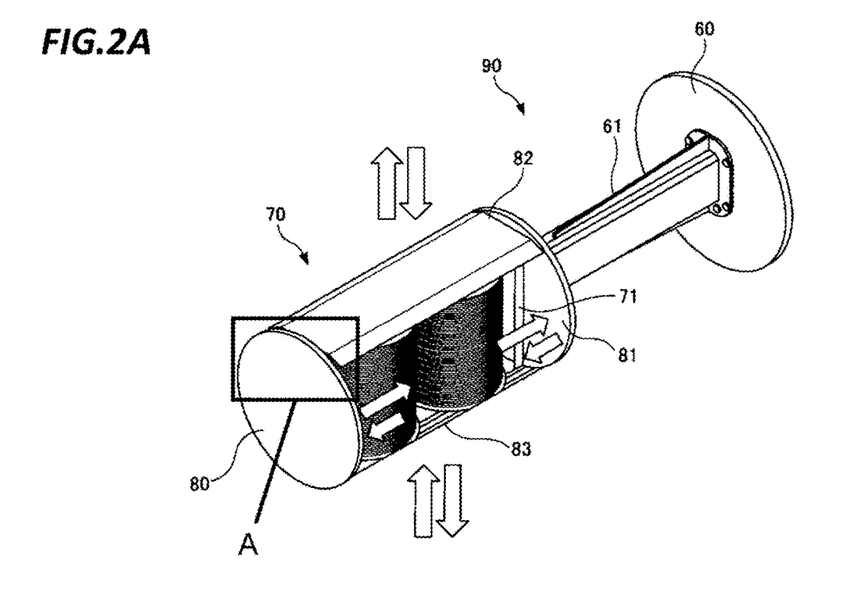
In FIG. 2A is a perspective view illustrating the entire configuration of the boat loader.
Figure 2B:
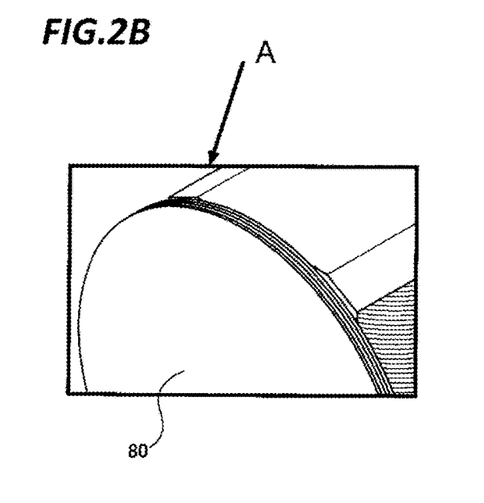
FIG. 2B is a view illustrating a portion of a heat shielding plate indicated by a solid line rectangle "A" in an enlarged scale.

FIGS. 2A and 2B are views illustrating an exemplary configuration of a boat loader of the magnetic annealing apparatus 200 according to the exemplary embodiment of the present disclosure. FIG. 2A is a perspective view illustrating the entire configuration of the boat loader 90, and FIG. 2B is a view illustrating a configuration of a heat shielding plate 80 in an enlarged scale.

In FIG. 2A, the boat loader 90 includes the cap 60, the wafer boat support 61, the wafer boat 70, and heat shielding plates 80 to 83. When the magnetic annealing processing is performed by the magnetic annealing apparatus 200, the heat shielding plates 80 to 83 prevent dissipation of heat from the heater 110 and temperature unevenness due to radiation of heat concentrated on a predetermined place, thereby facilitating uniformization of the heat radiated to the wafers W. The heat shielding plates 80 to 83 are installed to cover the periphery of the wafer boat 70. Specifically, the heat shielding plates 80 and 81 are installed to cover both ends of the wafer boat 70 in a longitudinal direction, and the heat shielding plates 82 and 83 are installed to cover the upper surface and the lower surface of the wafer boat 70, respectively.

As illustrated in FIG. 1, since the heater 110 is installed to cover the longitudinally extending surface of the processing container 100 but not installed at both sides of the processing container 100, the heat shielding plates 80 and 81 installed at both ends of the wafer boat 70 in the longitudinal direction serve to prevent heat dissipation. Meanwhile, in FIG. 2, since the wafers W are placed horizontally and loaded vertically, the uppermost wafer W and the lowermost wafer W in the loaded body are subjected to heat radiation directly from the heater 110, so that the temperature difference from the wafers W in the middle of the loaded body increases. Therefore, when the wafers W are placed horizontally and loaded vertically, the heating shielding plates 82 and 83 are installed to cover the wafers W at the upper and lower surfaces of the wafer boat 70 such that the heat from the heater 110 is reflected. This may facilitate the thermal uniformization of the loaded wafers W and evenly heat the wafers W.

Meanwhile, in a case where the wafers W are held in a vertically standing state at predetermined intervals in a lateral direction like books on a bookshelf by the wafer boat 70, the heat from the heater 110 is incident in a direction from the whole outer periphery to the center with respect to all the wafers W. Accordingly, there is less concern about concentration of the heat on predetermined places (the upper and lower surfaces) as in the case where the wafers W are held horizontally. Therefore, in such a case, it is not necessary to install the heat shielding plates 82 and 83 on the upper surface and the lower surface of the wafer boat 70, and it is sufficient to install the heat shielding plates 80 and 81 for heat insulation only at the both sides of the wafer board 70.

As such, since the installation places of the heat shielding plates 80 to 83 are appropriately selected depending on the arrangement method of the wafers W, the thermal uniformization of the wafers W may be appropriately performed.

The shielding plates 80 to 83 are non-magnetic, and may be made of various materials, for example, a non-magnetic metal material as long as the heat shielding effect is high. For example, stainless steel and titanium may be appropriately used for the heat shielding plates 80 to 83.

As illustrated in (b) of FIG. 2, the heat shielding plate 80 may be constituted by stacking a plurality of thin plates. Further, the heat shielding plate 82 may be formed with, for example, engaging holes to engage with projections of the wafer boast 70, as necessary.

Figure 3A:
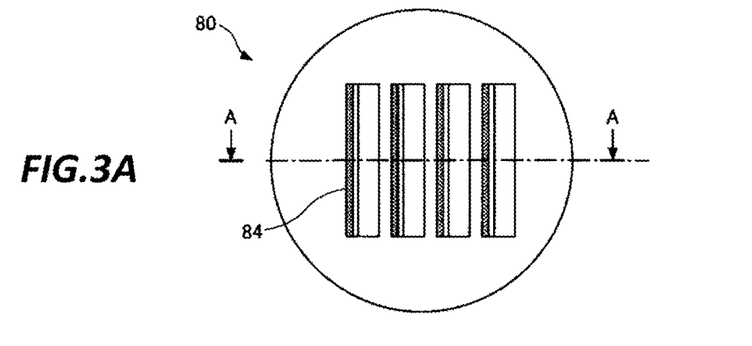
FIG. 3A is a front view of the heat shielding plate with a louver.
Figure 3B:
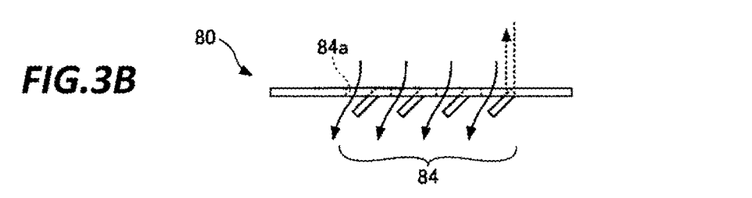
FIG. 3B is a cross-sectional view taken along line A-A of FIG. 3A.

FIGS. 3A to 3D are views illustrating various constitutional examples of the heat shielding plate 80. FIG. 3A is a front view of the heat shielding plate 80 with a louver 84. FIG. 3B is a cross-sectional view taken along line A-A of FIG. 3A. FIG. 3A illustrates an example in which the louver 84 is formed on the surface of the heat shielding plate 80. As illustrated in FIG. 3B, by forming the louver 84 on the surface of the heat shielding plate 80, openings 84a are formed in the surface of the heat shielding plate 80. Thus, evacuation may be sufficiently performed even on the periphery of the wafers W. Therefore, by forming the louver 84 in the heat shielding plate 80 as necessary, the evacuation may be sufficiently performed while maintaining an effect to shield the heat and prevent dissipation of the heat.

Meanwhile, the louver 84 may be formed by cutting and bending. When the openings 84a are formed by completely cutting out the heat shielding plate 80 without forming the louver 84, the heat will not be reflected in the openings 84a at all. Therefore, the heat dissipation effect may be reduced. When the louver 84 is formed by cutting and bending, the heat may be reflected on the surface of the louver 84. Therefore, the openings 84a for evacuation may be formed without considerably deteriorating the heat dissipation effect.

Figure 3C:
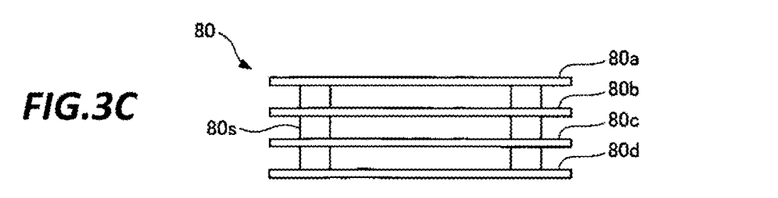
FIG. 3C is a top plan view of the heat shielding plate without a louver.

FIG. 3C is a top plan view of the heat shielding plate 80 without the louver 84. As illustrated in FIG. 3C, the heat shielding plate 80 may be constituted as a single heat shielding plate 80 by stacking a plurality of thin non-magnetic metal plates 80a to 80d spaced apart from each other by spacers 80s. FIG. 3C illustrates an example in which four non-magnetic metal plates 80a to 80d are stacked with spacers 80s being interposed therebetween, respectively, to constitute a single heat shielding plate 80. However, the number of the non-magnetic metal plates 80a to 80d constituting the single heat shielding plate 80 may be optionally set depending on the use. Each of the non-magnetic metal plates 80a to 80d may have a thickness in a range of 0.1 mm to 0.8 mm, or more specifically in a range of 0.1 mm to 0.5 mm. For example, non-magnetic metal plates 80a to 80d each having a thickness of about 0.3 mm may be used. Further, any material may be used for the non-magnetic metal plates 80a to 80d as long as it does not affect magnetic fields, but a metal material such as, for example, stainless steel or titan may be used. Meanwhile, the heat shielding plate 80 without the louver 84 has a plate-like shape as illustrated in FIGS. 2A and 2B.

FIG. 3C illustrates an example in which the heat shielding plate 80 is formed in a stacked structure without the louver 84. Of course, however, the heat shielding plate 80 may be constituted by forming a louver 84 in each of the non-magnetic metal plates 80a to 80d and constructing the non-magnetic metal plates 80a to 80d in the structure illustrated in FIG. 3C. The structure in FIG. 3C may be adopted regardless of the louver 84.

Figure 3D:
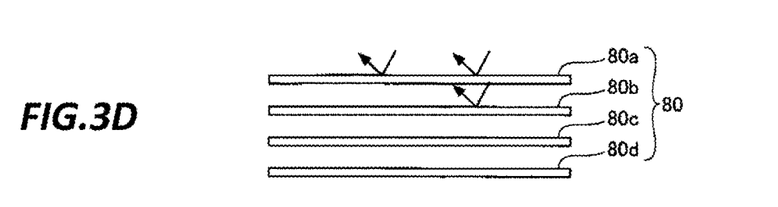
FIG. 3D is a view for explaining an advantage obtained when the heating shieling plate is constituted with a plurality of metal plates.

FIG. 3D is a view for explaining an advantage of constituting the heating shieling plate 80 with a plurality of non-magnetic metal plates. As illustrated in FIG. 3D, since a plurality of thin non-magnetic metal platers 80a to 80d are stacked and arranged at predetermined intervals, radiant heat may be reflected in the multi-layers, so that the reflection efficiency is enhanced, thereby enhancing the heat radiation prevention effect. In this regard, it is also the same as in the case of the heat shielding plate 80 with the louver 84.

Although FIGS. 3A to 3D illustrate the heat shielding plate 80 by way of example, the heat shielding plate 80 may also be constituted in the same manner. Meanwhile, in a case where the heat shielding plate 81 is formed with a hole through which the boat support 61 penetrates, the other portions may have the same configuration as those in the heat shielding plate 80.

Figure 4A:
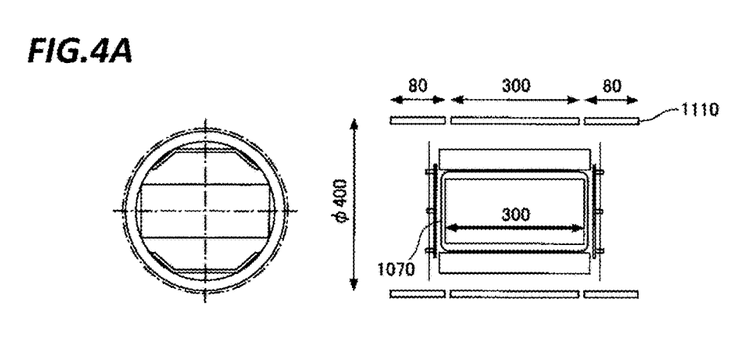
FIGS. 4A and 4B are views for explaining a difference in heater length between a test and research purpose magnetic annealing apparatus that processes a small number of wafers and a magnetic annealing apparatus according to an exemplary embodiment of the present disclosure that is capable of processing 100 wafers.
Figure 4B:
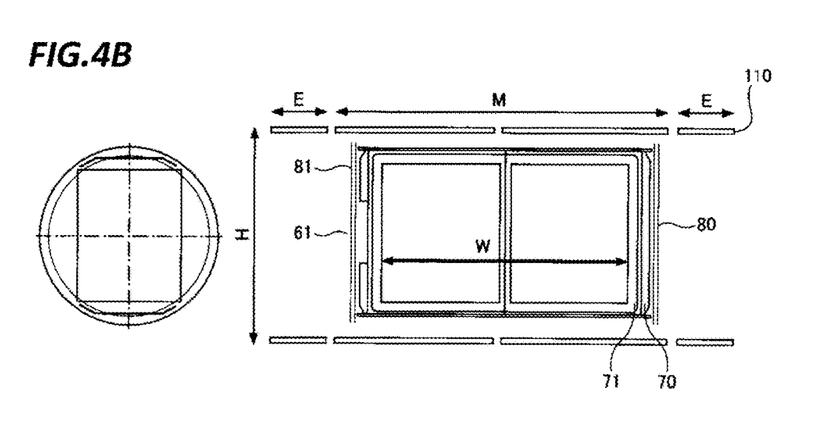

FIGS. 4A and 4B are views for explaining a difference in heater length between a testing and research purpose magnetic annealing apparatus that processes a small number of wafers and a magnetic annealing apparatus according to an exemplary embodiment of the present disclosure that is capable of processing 100 wafers. FIG. 4A is a view illustrating an exemplary testing and research purpose magnetic annealing apparatus. FIG. 4B is a view illustrating an exemplary magnetic annealing apparatus according to an exemplary embodiment of the present disclosure.

The test and research purpose magnetic annealing apparatus illustrated in FIG. 4A can process about ten sheets of wafers at one time. A wafer boat 1070 of the test and research purpose magnetic annealing apparatus has a width of about 300 mm and a height of about 400 mm. A heater 1110 has a length of about 300 mm in the central portion, and 80 mm in each end portions. Therefore, the total length is about 460 mm. Accordingly, the length of the heater 1110 is about 1.5 times (=460/300) the length of the wafer boat 1070.

Meanwhile, the magnetic annealing apparatus 200 according to the present exemplary embodiment illustrated in FIG. 4B may process 100 wafers at once. A wafer boat 70 has a width W of about 600 mm and a height H of about 600 mm. A heater 110 has a length of about 900 mm in the central portion M, and 100 mm in each end portion E. Therefore, the total length is about 1100 mm. First, comparing the central portions, the heater length is increased from 300 mm to 900 mm, which is three times longer. Further, the length of the heater 110 is about 1.7 times (=1000/600) the length of the wafer boat 1070. That is, the heater length is set to be 1.7 times or more the wafer boat length.

That is, the magnetic annealing apparatus 200 according to the present exemplary embodiment has a configuration in which the ratio of the length of the heater 110 to the length of the wafer boat 70 is increased so that heat can be supplied to the wafers W more uniformly. Thus, when the number of wafers W to be processed increases, it is more difficult to maintain the thermal uniformity. Therefore, in the magnetic annealing apparatus 200 according to the present exemplary embodiment, the thermal uniformity of the wafers W is secured by increasing the heater length as well as installing the heat shielding plates 80 to 83.

Figure 5A:
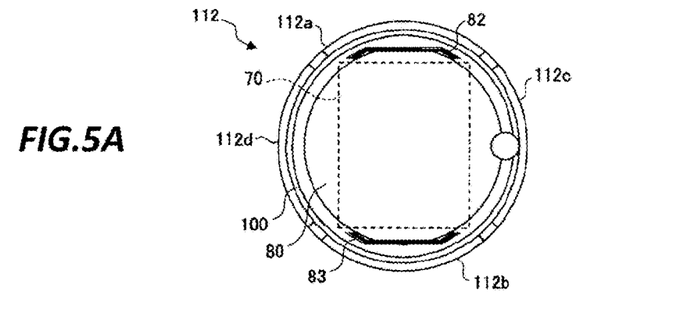
FIG. 5A is a front view of the portion more inside than the heater in the magnetic annealing apparatus according to the exemplary embodiment.
Figure 5B:
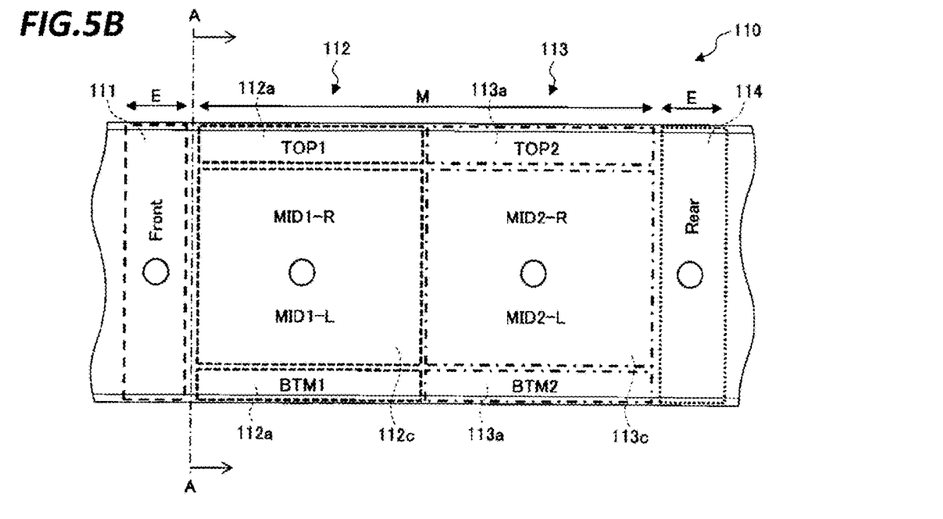
FIG. 5B is a side view of the heater of the magnetic annealing apparatus according to the exemplary embodiment.
Figure 5C:
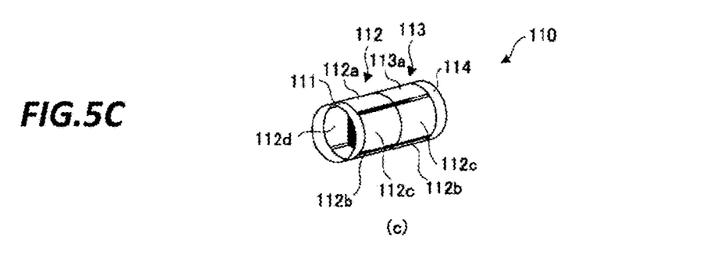
FIG. 5C is a perspective view of the portion more inside than the heater in the magnetic annealing apparatus according to the exemplary embodiment.

FIGS. 5A to 5C are views illustrating a relationship between a heater and a heat shielding plate in the magnetic annealing apparatus 200 according to an exemplary embodiment of the present disclosure. FIG. 5A is a front view of a portion more inside than the heater in the magnetic annealing apparatus according to the present exemplary embodiment. FIG. 5B is a side view of the heater of the magnetic annealing apparatus according to the present exemplary embodiment. FIG. 5C is a perspective view of a portion more inside than the heater in the magnetic annealing apparatus according to the present exemplary embodiment. Specifically, FIG. 5A is a front view when viewed from the A-A cross-section of FIG. 5B.

As illustrated in FIGS. 5B and 5C, the heater 110 of the annealing apparatus according to the present exemplary embodiment includes four heaters 111, 112, 113, 114 that cover four regions along the longitudinal direction. Further, each of the heater 111 at the front side and the heater 114 at the rear side covers the entire circumference of the processing container 100 with a single heater. However, as illustrated in FIGS. 3A to 3C, the heaters 112 and 113 in the central region are configured to cover the entire circumference of the processing container 100 with four divided heaters 112a to 112d, 113a to 113d in the regions of an upper surface, a lower surface, a right surface, and a left surface, respectively. In any case, the respective heaters 111 to 114 are arranged so as to substantially continuously cover the peripheral region of the wafers W in the longitudinally extending cylindrical surface of the processing container 100.

Accordingly, in a case where the wafers W are arranged in a vertically standing state on the wafer boat 70, the heat is suppled uniformly from the outside of each wafer W toward the center thereof. Meanwhile, in a case where the wafers W are loaded horizontally on the wafer boat 70, the wafers W near the upper portion and the lower portion of the loaded body, especially, the wafers W on the uppermost surface and the lowermost surface are subjected to heat radiation directly from the heaters 112a, 113a at the upper side and the heaters 112b, 113b at the lower side. Therefore, as illustrated in FIG. 5A, when the wafers W are placed horizontally, the heat shieling plates 82, 83 in the vertical direction are installed so as to prevent direct irradiation of the heat to the wafers W loaded in the upper portion and the lower portion.

Meanwhile, the heat shielding plates 80, 81 are installed on the front end surface and the rear end surface where the heaters 111 to 114 directly irradiating the heat do not exist, thereby preventing the heat from being radiated and emitted from the wafer boat 70. As such, in the magnetic annealing apparatus 200 according to the present exemplary embodiment, the heat shielding pates 80 to 83 are properly arranged in consideration of the arrangement of the heaters 111 to 114 and the direction of holding the wafers W.

Figure 6A:
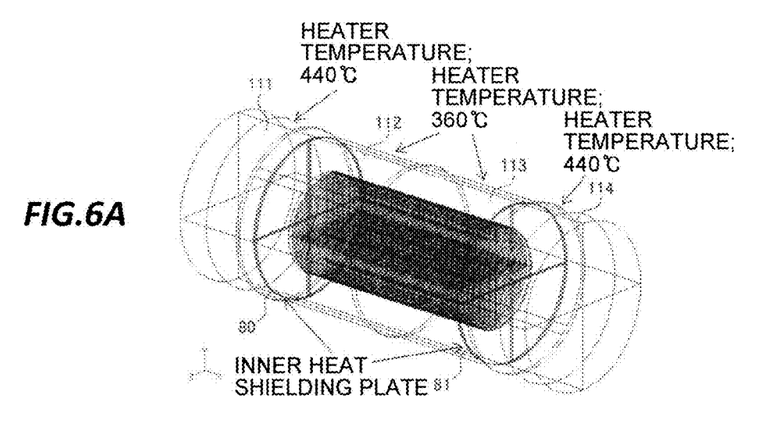
FIG. 6A is a view illustrating an exemplary embodiment in which two heat shielding plates are installed.
Figure 6B:
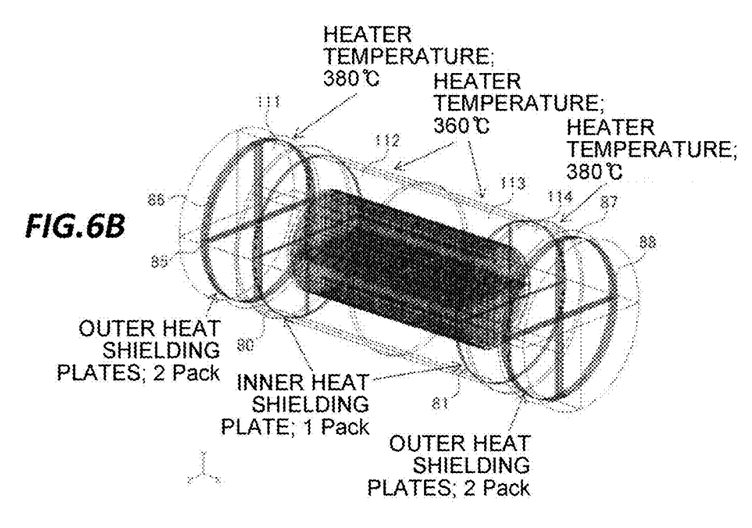
FIG. 6B is a view illustrating an exemplary embodiment in which two heat shielding plates are further installed outside each of the two heat shielding plate.

FIGS. 6A and 6B are views illustrating an exemplary magnetic annealing apparatus according to an exemplary embodiment of the present disclosure in which the number of heat shielding plates is increased. FIG. 6A is a view illustrating an exemplary embodiment in which two heat shielding plates are installed. FIG. 6A is a view illustrating an example in which a total of two heat shielding plates 80, 81 are arranged one by one in both ends of the wafer boat 70 in the longitudinal direction, similarly to the exemplary embodiments described so far. Further, each of the heat shielding plates 80, 81 is constituted with four non-magnetic metal plates. In this example, when the heaters 111, 114 at both ends were set to a heater temperature of 440° C. and the heaters 112, 113 in the central region were set to a heater temperature of 360° C., a desired temperature condition was obtained.

Meanwhile, FIG. 6B is a view illustrating an exemplary embodiment in which heat shielding plates 85 to 88 are further installed two in the outside of each of the two heat shielding plates. In this example, two heat shielding plates 85, 86 are installed in the outside of the heat shielding plate 80, and two heat shielding plates 87, 88 are installed in the outside of the heat shielding plate 81. In addition, each of the heat shielding plates 85 to 88 is constituted as a single heat shielding plate by four non-magnetic metal plates, which is configured to be the same as the heat shielding plates 80, 81.

In this case, as for the heaters 112, 113 in the central region, similarly to the exemplary embodiment according to FIG. 6A, the heater temperature was 360° C. However, as for the heaters 111, 114 at both ends, the same temperature condition as that in FIG. 6A was realized at a heater temperature of 380° C. That is, in the exemplary embodiment according to FIG. 6B, since the heat shielding plates 85 to 88 are additionally installed at both ends, a heat insulating effect was enhanced, and thus the same temperature condition as in FIG. 6A was realized by setting a heater temperature to be lower than that of FIG. 6A.

Thus, it is possible to lower the setting temperatures of the heaters 111, 114 at both ends by increasing the number of heat shielding plates 80 to 88. Therefore, power saving may be achieved by reducing the heater power.

Figure 7A:
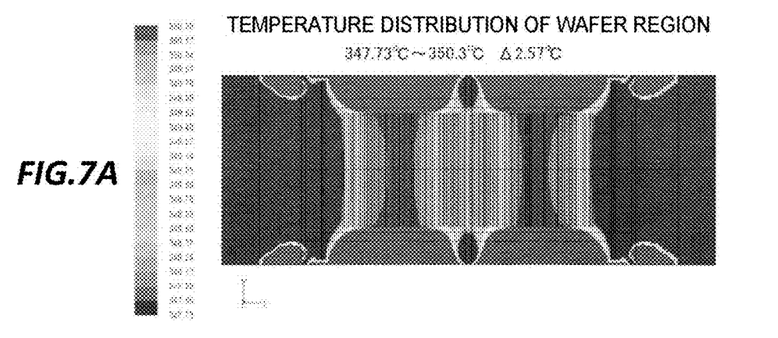
FIG. 7A is a simulation result of the exemplary embodiment according to FIG. 6A.
Figure 7B:
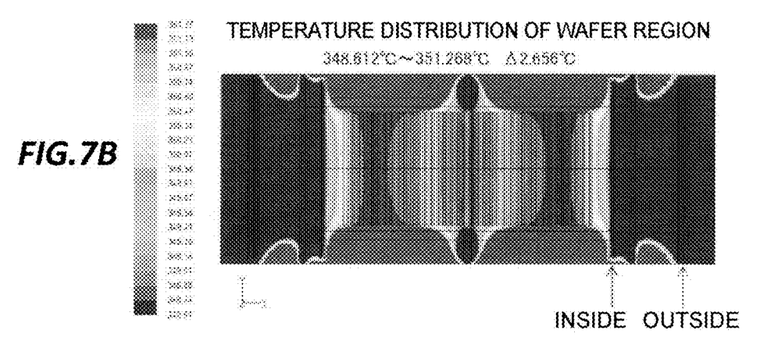
FIG. 7B is a simulation result of the exemplary embodiment according to FIG. 6B.

FIGS. 7A and 7B are views illustrating simulation results of FIG. 6A and FIG. 6B. FIG. 7A is a simulation result of the exemplary embodiment according to FIG. 6A. FIG. 7B is a simulation result of the exemplary embodiment according to FIG. 6B.

Comparing FIG. 7A and FIG. 7B, it can be seen that both have a similar temperature range and a temperature difference thereof, and substantially the same temperature distributions are obtained. As described above, since the heat insulating effect is enhanced by increasing the number of heat shielding plates 80 to 88, even though the setting temperature of the heater is lowered, the same temperature condition may be obtained.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A magnetic annealing apparatus comprising:
a processing container having a horizontally-elongated tubular shape, and configured to perform a magnetic annealing processing on a plurality of substrates accommodated therein in a magnetic field;
a heating unit provided to cover at least a part of a surface of the processing container that extends in a longitudinal direction, from outside;
a magnet provided to cover the heating unit from the outside of the heating unit;
a substrate holder configured to hold the plurality of substrates within the processing container; and
a plurality of shielding plates, wherein a first shielding plate of the plurality of shielding plates is provided at one end of the processing container and a second shielding plate of the plurality of shielding plates is provided at another end of the processing container, respectively,
wherein at least one of the plurality of heat shielding plates includes a slit formed thereon.

2. The magnetic annealing apparatus of claim 1, wherein the first shielding plate is arranged substantially perpendicular to the longitudinal direction and the second shielding plate is arranged substantially perpendicular to the longitudinal direction.

3. The magnetic annealing apparatus of claim 1, wherein the substrate holder is configured to hold the plurality of substrates at predetermined intervals along the longitudinal direction in a substantially vertically standing state.

4. The magnetic annealing apparatus of claim 1, wherein the substrate holder is configured to hold the plurality of substrates at predetermined intervals in the vertical direction in a substantially horizontally placed state so as to form a loaded body.

5. The magnetic annealing apparatus of claim 4, wherein the substrate holder is configured to hold a plurality of loaded bodies in parallel with each other along the longitudinal direction.

6. The magnetic annealing apparatus of claim 4, wherein the heating unit covers substantially the whole of the surface of the processing container that extends in the longitudinal direction.

7. The magnetic annealing apparatus of claim 6, wherein the heat shielding plate is provided to cover each of an uppermost surface and a lowermost surface of the plurality of substrates through the substrate holder.

8. The magnetic annealing apparatus of claim 1, wherein at least some of the plurality of heat shielding plates are made from non-magnetic metal plates.

9. The magnetic annealing apparatus of claim 8, wherein the at least some of the plurality of heat shielding plates are arranged at predetermined intervals with spacers being interposed therebetween.

10. The magnetic annealing apparatus of claim 1, wherein at least one of the plurality of heat shielding plates includes a plurality of louver-shaped slits formed by cutting and bending.

11. The magnetic annealing apparatus of claim 1, wherein a length of the heating unit in the longitudinal direction is 1.7 times that of the substrate holder or more.

12. The magnetic annealing apparatus of claim 1, wherein the processing container has a cylindrical shape.

13. The magnetic annealing apparatus of claim 1, wherein the slit is louver-shaped.

14. The magnetic annealing apparatus of claim 1, wherein the slit is formed by cutting and bending.

15. The magnetic annealing apparatus of claim 1, wherein the at least one of the plurality of heat shielding plates is provided in parallel with the heating unit.

* * * * *